(12) United States Patent
Yang et al.

(10) Patent No.: US 12,389,157 B2
(45) Date of Patent: Aug. 12, 2025

(54) SPEAKER BOX

(71) Applicant: AAC Microtech (Changzhou) Co., Ltd., Jiangsu (CN)

(72) Inventors: Haijuan Yang, Changzhou (CN); Shuwen Wu, Changzhou (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 233 days.

(21) Appl. No.: 18/325,948

(22) Filed: May 30, 2023

(65) Prior Publication Data

US 2024/0179456 A1 May 30, 2024

Related U.S. Application Data

(63) Continuation of application No. PCT/CN2023/085126, filed on Mar. 30, 2023.

(30) Foreign Application Priority Data

Nov. 30, 2022 (CN) .......................... 202223200951.2

(51) Int. Cl.
*H04R 1/28* (2006.01)
*H04R 1/02* (2006.01)
(Continued)

(52) U.S. Cl.
CPC ........... *H04R 1/288* (2013.01); *H04R 1/2888* (2013.01); *H04R 9/025* (2013.01); *H04R 9/045* (2013.01); *H04R 9/06* (2013.01); *H05K 1/189* (2013.01)

(58) Field of Classification Search
CPC ........ H04R 1/28; H04R 1/288; H04R 1/2803; H04R 1/2869; H04R 1/2873;
(Continued)

(56) References Cited

U.S. PATENT DOCUMENTS 7,840,022 B2 * 11/2010 Matsumura .......... H04R 1/2803
381/345
8,965,025 B2 * 2/2015 Shen ...................... H04R 1/288
381/345
(Continued)

FOREIGN PATENT DOCUMENTS

CN 204948357 U * 1/2016
CN 206433160 U * 8/2017
(Continued)

*Primary Examiner* — Edgardo San Martin
(74) *Attorney, Agent, or Firm* — Wiersch Law Group

(57) ABSTRACT

The present disclosure discloses a speaker box including a cover fixed between the frame and the magnetic circuit system; the cover includes a bottom wall set at a bottom of the speaker unit and a side wall extending from the bottom wall and set at a side of the speaker unit; the vibration system, the frame, the cover and the magnetic circuit system enclosing a internal space of the speaker unit; the cover is hot pressed from polyethylene glycol terephthalate film, the bottom wall is provided with an array of first leakage holes communicating the internal space and the rear cavity, the side wall is provided with an array of second leakage holes communicating the internal space and the rear cavity. The speaker box can be flexibly applied to a variety of complex shapes of the housing and can enhance the filling amount of sound-absorbing powder.

8 Claims, 4 Drawing Sheets

(51) Int. Cl.
 *H04R 9/02* (2006.01)
 *H04R 9/04* (2006.01)
 *H04R 9/06* (2006.01)
 *H05K 1/18* (2006.01)

(58) Field of Classification Search
 CPC ........ H04R 1/2876; H04R 1/02; H04R 1/025; H04R 7/04; H04R 9/025; H04R 9/02; H04R 9/04; H04R 9/045; H04R 9/046; H04R 9/06; H04R 9/18; H04R 31/003; H04R 31/006; H04R 2400/11; H04R 2499/11; H04R 2499/10
 See application file for complete search history.

(56) References Cited

U.S. PATENT DOCUMENTS

| | | | | |
|---|---|---|---|---|
| 9,635,455 | B2* | 4/2017 | Schöffmann | H04R 1/288 |
| 10,349,165 | B2* | 7/2019 | Cao | H04R 1/288 |
| 10,368,160 | B2* | 7/2019 | Qin | H04R 1/288 |
| 10,701,475 | B2* | 6/2020 | Chen | H04R 1/288 |
| 10,820,106 | B2* | 10/2020 | Gu | H04R 9/025 |
| 10,932,045 | B2* | 2/2021 | Wu | H04R 9/06 |
| 11,178,494 | B2* | 11/2021 | Zhao | H04R 9/025 |
| 11,330,363 | B2* | 5/2022 | Qin | H04R 1/2811 |
| 11,665,472 | B2* | 5/2023 | Qiu | H04R 1/2849 181/151 |
| 11,917,362 | B2* | 2/2024 | Yang | H04R 1/288 |
| 11,956,614 | B2* | 4/2024 | Yang | H04R 9/025 |
| 12,052,540 | B2* | 7/2024 | Jin | H04R 9/06 |
| 12,101,616 | B2* | 9/2024 | Yang | H04R 1/06 |
| 12,120,495 | B2* | 10/2024 | Ren | H04R 9/06 |
| 2020/0053476 | A1* | 2/2020 | Xiao | H04R 9/025 |
| 2020/0213696 | A1* | 7/2020 | Wang | H04R 1/06 |
| 2023/0328428 | A1* | 10/2023 | Yang | H04R 1/2803 381/353 |
| 2023/0328450 | A1* | 10/2023 | Yang | H04R 9/046 |
| 2024/0048913 | A1* | 2/2024 | Cai | H04R 1/2834 |
| 2024/0056738 | A1* | 2/2024 | Tong | H04R 9/025 |
| 2024/0179455 | A1* | 5/2024 | Yang | H04R 9/06 |
| 2024/0223939 | A1* | 7/2024 | Liu | H04R 1/025 |

FOREIGN PATENT DOCUMENTS

| | | | | |
|---|---|---|---|---|
| CN | 209283504 U | * | 8/2019 | |
| CN | 108551639 B | * | 5/2020 | ............ H04R 9/02 |
| CN | 210986334 U | * | 7/2020 | |
| CN | 212628397 U | * | 2/2021 | |
| CN | 212936193 U | * | 4/2021 | |
| CN | 114374915 A | * | 4/2022 | ............ H04R 9/025 |
| CN | 114845216 A | * | 8/2022 | ............ H04M 1/03 |
| CN | 217283374 U | * | 8/2022 | |
| CN | 115361606 A | * | 11/2022 | |
| CN | 116709141 A | * | 9/2023 | |

\* cited by examiner

A-A

SPEAKER BOX

FIELD OF THE PRESENT DISCLOSURE

The present disclosure relates to electro-acoustic transducers, especially relates to a speaker box.

DESCRIPTION OF RELATED ART

In the related arts, the speaker box includes a housing, a speaker unit housed in the housing and a breathable isolation parts with three-dimensional structure shape, the breathable isolation member and the housing enclosed to form a shelter space filled with sound-absorbing powder.

However, when the shape of the housing is complicated, the breathable isolation member with three-dimensional structure shape needs to be adapted to the shape of the housing, thus causing the three-dimensional structure shape of the breathable isolation member to be complicated and difficult to shape. In addition, the breathable isolation member is glued to the housing, and in order to ensure the reliability of the gluing, the gluing flange of the breathable isolation member needs to be reserved a certain width, which causes space waste and is not conducive to improving the filling amount of sound-absorbing powder.

Therefore, it is necessary to provide an improved speaker box to overcome the problems mentioned above.

SUMMARY OF THE INVENTION

The present disclosure provides a speaker box can be flexibly applied to various complex shapes of housing and can enhance the filling amount of sound-absorbing powder.

The speaker box comprising: a housing and a speaker unit housed in the housing, the speaker unit and the housing form the rear cavity of the speaker box, the rear cavity is filled with sound-absorbing powder; wherein, the speaker unit comprises a frame, a vibration system and a magnetic circuit system respectively fixed to the frame, and a cover fixed between the frame and the magnetic circuit system; the cover comprises a bottom wall set at a bottom of the speaker unit and a side wall extending from the bottom wall and set at a side of the speaker unit; the vibration system, the frame, the cover and the magnetic circuit system enclosing a internal space of the speaker unit; the cover is hot pressed from polyethylene glycol terephthalate film, the bottom wall is provided with an array of first leakage holes communicating the internal space and the rear cavity, the side wall is provided with an array of second leakage holes communicating the internal space and the rear cavity.

Further, the array of first leakage holes and the array of second leakage holes are formed by laser or die cutting.

Further, the array of first leakage holes includes a plurality of first circular leakage holes, and the adjacent first circular leakage holes are equally spaced.

Further, the array of second leakage holes includes a plurality of second circular leakage holes, and the adjacent second circular leakage holes are equally spaced.

Further, the housing includes a metal upper housing and a metal lower housing connected with the metal upper housing cover, the metal upper housing is provided with an outlet hole, the speaker unit is fixed to the metal upper housing and communicates with the outlet hole, the metal upper housing, the metal lower housing and the speaker unit enclose the rear cavity.

Further, the contours of the array of first leakage holes extending along the edge of the bottom wall and the edge of the magnetic circuit system.

Further, the array of second leakage holes having an isosceles trapezoidal profile, and the length of one bottom edge of the isosceles trapezoid near the bottom wall is greater than the length of the other bottom edge of the isosceles trapezoid away from the bottom wall.

Further, the vibration system includes a diaphragm, a flexible circuit board spaced from the diaphragm, a bracket connecting the diaphragm and the flexible circuit board, and a coil fixed to the bracket to drive the diaphragm vibration and sound, the coil electrically connected to the flexible circuit board, the flexible circuit board fixed to the frame and electrically connected to an external power supply via an external circuit board.

Further, the magnetic circuit system includes a lower clamp plate, a main magnet fixed to the lower clamp plate, a secondary magnet fixed to the lower clamp plate and spaced from the main magnet, a main pole core fixed to the main magnet, and a ring-shaped secondary pole core fixed to the secondary magnet, the frame being a metal frame and fixed to the secondary pole core.

Compared to related arts, the speaker box of the present disclosure isolate the sound-absorbing powder into the internal space of the speaker unit by the cover of the speaker unit, so that the entire rear cavity enclosed by the speaker unit and the housing can be filled with sound-absorbing powder, which enhances the filling amount of the sound-absorbing powder, and various complex shapes of the housing can be applied flexibly; In addition, the cover is hot pressed from polyethylene glycol terephthalate film and forms an array of first leakage holes on the bottom wall and an array of second leakage holes on the side wall with two leak paths in different directions, increasing leak area and leak reliability. At the same time, the good toughness of polyethylene glycol terephthalate film reduces the risk of cover cracking, and the thin thickness of polyethylene glycol terephthalate film makes the cover itself not occupy too much space, which can further enhance the filling amount of acoustic powder.

BRIEF DESCRIPTION OF THE DRAWINGS

The present disclosure will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
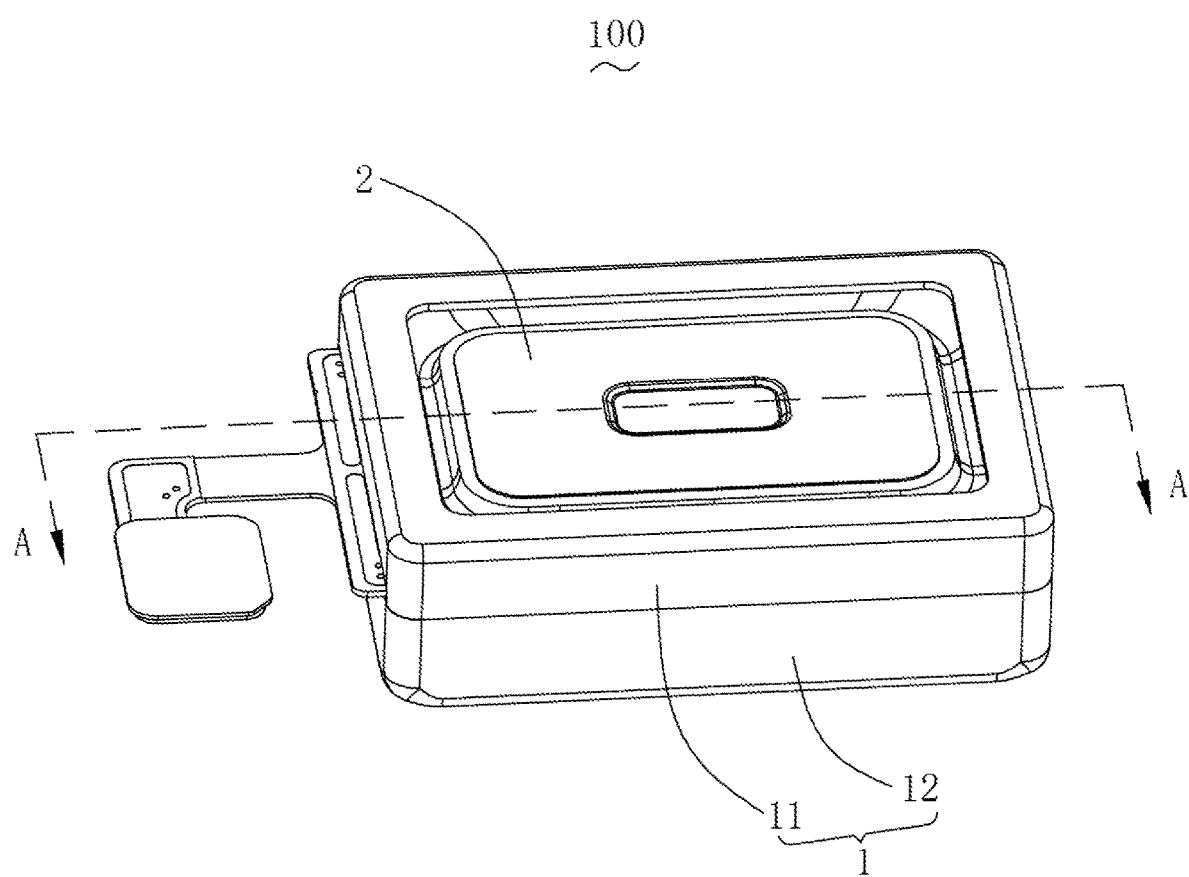
FIG. 1 is a structure schematic of a speaker box of the present disclosure.
Figure 2:
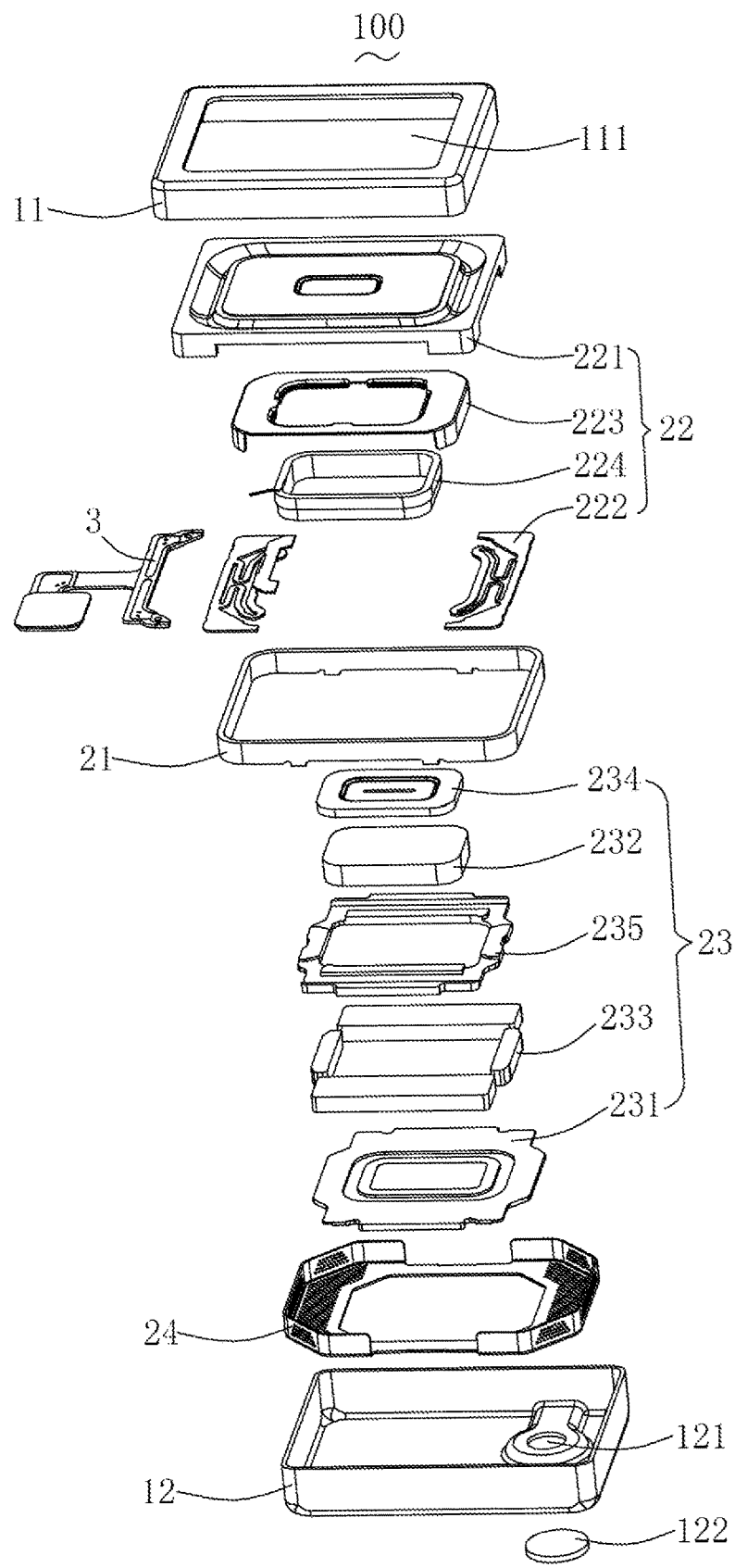
FIG. 2 is an exploded view of the speaker box of the present disclosure.
Figure 3:
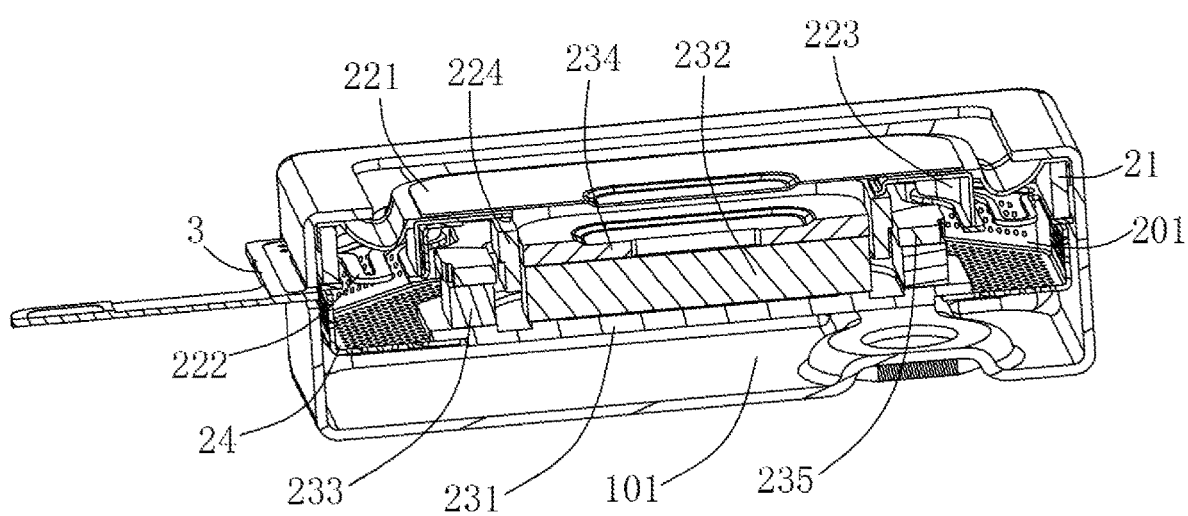
FIG. 3 is a cross-sectional view of the speaker box taken along line A-A in FIG. 1.
Figure 4:
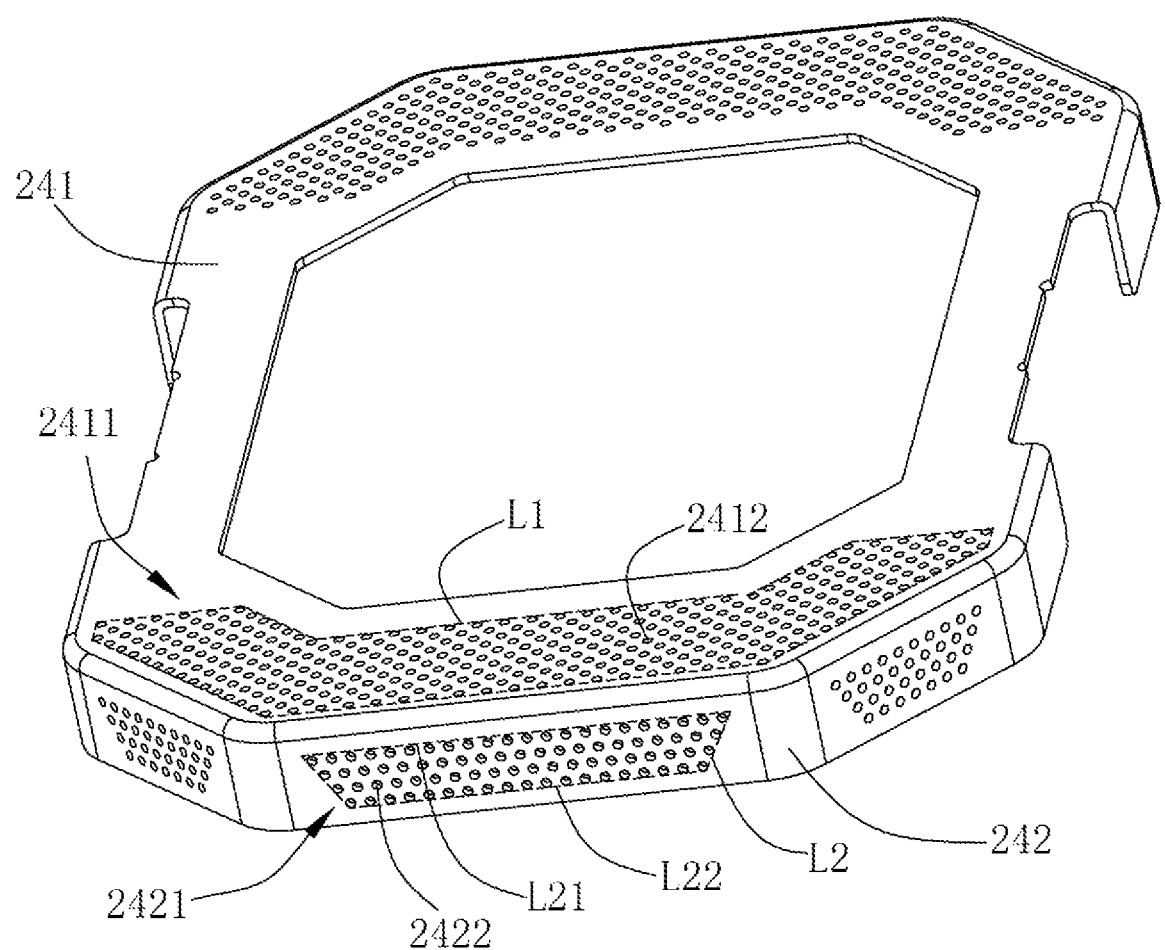
FIG. 4 is a structure schematic of a cover of the present disclosure.

Please refer to FIGS. 1-4 together, a speaker box 100 comprising: a housing 1 and a speaker unit 2 housed in the housing 1, the speaker unit 2 and the housing 1 form the rear cavity 101 of the speaker box 2, the rear cavity 101 is filled with sound-absorbing powder.

The speaker unit 2 comprises a frame 21, a vibration system 22 and a magnetic circuit system 23 respectively fixed to the frame 21, and a cover 24 fixed between the frame 21 and the magnetic circuit system 23. The cover 24 comprises a bottom wall 241 set at a bottom of the speaker unit 2 and side walls 242 extending from the bottom wall 241 and set at a side of the speaker unit 2. The vibration system 22, the frame 21, the cover 24 and the magnetic circuit system 23 enclosing a internal space 201 of the speaker unit 2. The cover 24 is hot pressed from polyethylene glycol terephthalate film, the bottom wall 241 is provided with an array of first leakage holes 2411 communicating the internal space 201 and the rear cavity 101, the side wall 242 is provided with an array of second leakage holes 2421 communicating the internal space 201 and the rear cavity 101.

The array of first leakage holes 2411 and the array of second leakage holes 2421 are formed by laser or die cutting.

The array of first leakage holes 2411 includes a plurality of first circular leakage holes 2412, and the adjacent first circular leakage holes 2412 are equally spaced. The array of second leakage holes 2421 includes a plurality of second circular leakage holes 2422, and the adjacent second circular leakage holes 2422 are equally spaced.

The contours L1 of the array of first leakage holes 2411 extending along the edge of the bottom wall 241 and the edge of the magnetic circuit system 23. The array of second leakage holes 2421 having an isosceles trapezoidal profile L2, and the length of one bottom edge L21 of the isosceles trapezoid near the bottom wall 241 is greater than the length of the other bottom edge L22 of the isosceles trapezoid away from the bottom wall 241, the structural strength of the side wall 242 can be ensured.

As a preference, the housing 1 includes a metal upper housing 11 and a metal lower housing 12 connected with the metal upper housing cover 11, the metal upper housing 11 is provided with an outlet hole 111, the speaker unit 2 is fixed to the metal upper housing 11 and communicates with the outlet hole 111, the metal upper housing 11, the metal lower housing 12 and the speaker unit 2 enclose the rear cavity 101. The metal lower housing 12 is provided with a powder filling hole 121 communicating with the rear cavity 101 and a sealing piece 122 sealing the powder filling hole 121.

As a preference, the vibration system 22 includes a diaphragm 221, a flexible circuit board 222 spaced from the diaphragm 221, a bracket 223 connecting the diaphragm 221 and the flexible circuit board 222, and a coil 224 fixed to the bracket 223 to drive the diaphragm 221 vibration and sound, the coil 224 electrically connected to the flexible circuit board 222, the flexible circuit board 222 fixed to the frame 21 and electrically connected to an external power supply via an external circuit board 3.

As a preference, the magnetic circuit system 23 includes a lower clamp plate 231, a main magnet 232 fixed to the lower clamp plate 231, a secondary magnet 233 fixed to the lower clamp plate 231 and spaced from the main magnet 232, a main pole core 234 fixed to the main magnet 232, and a ring-shaped secondary pole core 235 fixed to the secondary magnet 233, the frame 21 being a metal frame and fixed to the secondary pole core 235.

Compared with related technology, the speaker box of the present disclosure isolate the sound-absorbing powder into the internal space of the speaker unit by the metal cover of the speaker unit, so that the entire rear cavity enclosed by the speaker unit and the housing can be filled with sound-absorbing powder, which enhances the filling amount of the sound-absorbing powder, and various complex shapes of the housing can be applied flexibly; In addition, the cover is hot pressed from polyethylene glycol terephthalate film and forms an array of first leakage holes on the bottom wall and an array of second leakage holes on the side wall with two leak paths in different directions, increasing leak area and leak reliability. At the same time, the good toughness of polyethylene glycol terephthalate film reduces the risk of cover cracking, and the thin thickness of polyethylene glycol terephthalate film makes the cover itself not occupy too much space, which can further enhance the filling amount of acoustic powder.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A speaker box comprising: a housing and a speaker unit housed in the housing, the speaker unit and the housing form the rear cavity of the speaker box, the rear cavity is filled with sound-absorbing powder;

wherein, the speaker unit comprises a frame, a vibration system and a magnetic circuit system respectively fixed to the frame, and a cover fixed between the frame and the magnetic circuit system;

the cover comprises a bottom wall set at a bottom of the speaker unit and a side wall extending from the bottom wall and set at a side of the speaker unit;

the vibration system, the frame, the cover and the magnetic circuit system enclosing an internal space of the speaker unit;

the vibration system includes a diaphragm, a flexible circuit board spaced from the diaphragm, a bracket connecting the diaphragm and the flexible circuit board, and a coil fixed to the bracket to drive the diaphragm vibration and sound, the diaphragm directly connected to the bracket, the diaphragm connected to the coil indirectly, the coil electrically connected to the flexible circuit board, the flexible circuit board fixed to the frame and electrically connected to an external power supply via an external circuit board;

the cover is hot pressed from polyethylene glycol terephthalate film, the bottom wall is provided with an array of first leakage holes communicating the internal space and the rear cavity, the side wall is provided with an array of second leakage holes communicating the internal space and the rear cavity.

2. The speaker box as described in claim 1, wherein the array of first leakage holes and the array of second leakage holes are formed by laser or die cutting.

3. The speaker box as described in claim 1, wherein the array of first leakage holes includes a plurality of first circular leakage holes, and the adjacent first circular leakage holes are equally spaced.

4. The speaker box as described in claim 1, wherein the array of second leakage holes includes a plurality of second circular leakage holes, and the adjacent second circular leakage holes are equally spaced.

5. The speaker box as described in claim 1, wherein the housing includes a metal upper housing and a metal lower housing connected with the metal upper housing cover, the metal upper housing is provided with an outlet hole, the speaker unit is fixed to the metal upper housing and communicates with the outlet hole, the metal upper housing, the metal lower housing and the speaker unit enclose the rear cavity.

6. The speaker box as described in claim 1, wherein the contours of the array of first leakage holes extending along the edge of the bottom wall and the edge of the magnetic circuit system.

7. The speaker box as described in claim 1, wherein the array of second leakage holes having an isosceles trapezoidal profile, and the length of one bottom edge of the isosceles trapezoid near the bottom wall is greater than the length of the other bottom edge of the isosceles trapezoid away from the bottom wall.

8. The speaker box as described in claim 1, wherein the magnetic circuit system includes a lower clamp plate, a main magnet fixed to the lower clamp plate, a secondary magnet fixed to the lower clamp plate and spaced from the main magnet, a main pole core fixed to the main magnet, and a ring-shaped secondary pole core fixed to the secondary magnet, the frame being a metal frame and fixed to the secondary pole core.

* * * * *